(12) United States Patent
Hoffmann et al.

(10) Patent No.: US 6,768,667 B2
(45) Date of Patent: Jul. 27, 2004

(54) SEMICONDUCTOR MEMORY DEVICE

(75) Inventors: Kurt Hoffmann, Taufkirchen (DE);
Oskar Kowarik, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/254,693

(22) Filed: Sep. 25, 2002

(65) Prior Publication Data

US 2003/0058710 A1 Mar. 27, 2003

(30) Foreign Application Priority Data

Sep. 25, 2001 (DE) .......................................... 101 47 137

(51) Int. Cl.[7] .............................................. G11C 11/24
(52) U.S. Cl. ...................................... 365/149; 365/177
(58) Field of Search .................................. 365/149, 177

(56) References Cited

U.S. PATENT DOCUMENTS

| | | | |
|---|---|---|---|
| 3,614,753 A | | 10/1971 | Wahlstrom .................... 365/149 |
| 3,876,992 A | | 4/1975 | Pricer .......................... 365/149 |
| 5,227,660 A | * | 7/1993 | Horiuchi et al. ............. 257/588 |
| 5,289,421 A | * | 2/1994 | Lee et al. .................... 365/206 |
| 5,365,477 A | * | 11/1994 | Cooper, Jr. et al. ......... 365/174 |
| 6,258,684 B1 | * | 7/2001 | Kang .......................... 438/311 |

OTHER PUBLICATIONS

Nitayama, A. et al.: "Future Directions For DRAM Memory Cell Technology", IEEE, 1998, pp. 355–358.

* cited by examiner

*Primary Examiner*—M. Tran
(74) *Attorney, Agent, or Firm*—Laurence A. Greenberg; Werner H. Stemer; Gregory L. Mayback

(57) ABSTRACT

A DRAM memory cell having an isolation transistor formed from a bipolar transistor.

15 Claims, 9 Drawing Sheets

Precharge: "1"

"0"

Reading: "1"

"0"

Read Signal:

SEMICONDUCTOR MEMORY DEVICE

BACKGROUND OF THE INVENTION

Field of the Invention

The present invention relates to a semiconductor memory device having a memory cell array in which a multiplicity of memory cells each including an isolation transistor and a storage capacitor are configured in a matrix-like manner between a word line and a bit line.

As is known, DRAM cells (Dynamic Random Access Memory) include a cell capacitor, on which the memory information is stored as quantity of charge, and a MOS isolation or selection transistor that either connects a terminal of the cell capacitor to the bit line or isolates the terminal of the cell capacitor from the bit line. The other terminal of the cell capacitor is at a fixed potential, the so-called plate. The MOS isolation transistors are driven via word lines.

FIG. 23 diagrammatically shows prior art DRAM memory cells Z each including an isolation transistor T and a cell capacitor C. These memory cells Z are located in a matrix-like manner in a memory cell array with word lines WL and bit lines BL. The cell capacitor C lies between a plate PL and the isolation transistor T. The gate of the isolation transistor T is driven by a word line WL and the source or drain is connected to a bit line BL.

The memory cells themselves can be realized in different ways. In the case of the so-called stacked cell, the storage capacitor lies above the MOS isolation transistor, while in the case of the trench cell, the storage capacitor is provided below the MOS isolation transistor.

With increasing miniaturization, in trench memory cells endeavors are made to incorporate the MOS isolation transistor vertically into the trench. The technological realization of such a memory cell is relatively difficult.

In all miniaturizations of stacked cells and trench cells, at least one of the following problems always arises:

(a) the reverse current of the MOS isolation transistors rises since, in particular, the channel length thereof becomes shorter; and/or (b) the current of the MOS isolation transistors decreases.

As is known, bipolar transistors and MOS transistors differ, inter alia, in the profile of the drain current (collector current) $I_D$ in dependence on the voltage $V_{GS}$ or $V_{BE}$ present between the gate and the source or the base and the emitter, respectively. FIG. 24 shows this dependence for a MOS transistor with a threshold voltage $V_T=0.1$ V or $V_T=0.4$ V and for a bipolar transistor, in which the areas for the width and the length of the channel of the MOS transistors and the emitter area of the bipolar transistor are assumed to have the same magnitude. As can be seen, from this FIG. 24, the slope of the current curves for the MOS transistors is significantly shallower than in the case of the bipolar transistor.

This means then, that below a base-emitter voltage $V_{BE}$ of about 0.7 V, the bipolar transistor turns off significantly earlier than the MOS transistors, and the reverse currents for $V_{BE}=0$ V are less than $10^{-15}$ A in the case of bipolar transistors with a minimal size. This is comparable with the reverse currents of MOS transistors with threshold voltages $V_T$ above 1 V.

Above a base-emitter voltage $V_{BE}=0.7$ V, the current of bipolar transistors is considerably greater than in the case of MOS transistors on account of the exponential dependence on the base-emitter voltage.

To summarize, the following thus emerges:

given the same area as MOS transistors, above a specific drain voltage $U_D$ of 0.7 V, for example, bipolar transistors have a higher current than MOS transistors.

Furthermore, given the same area as MOS transistors, below a specific drain voltage $U_D$ of 0.7 V, for example, bipolar transistors have lower reverse currents than MOS transistors. This means that, given the same area, bipolar transistors conduct better than MOS transistors.

In order to solve the above-outlined problem area of the excessively high reverse currents and excessively low active currents in the case of memory configurations, it would thus be expedient, in principle, to use bipolar transistors instead of MOS transistors as isolation transistors in DRAM memory cells. However, this has been regarded as being impossible heretofore in the case of a memory cell structure in accordance with that shown in FIG. 23, since in the case of this structure, on account of the very high base voltages $U_{BE}=U(\text{"1"})+0.7$ V required for a "1" state during writing, word line currents that are much too large and that can no longer be processed result if a "0" state is to be written to a different cell on this word line.

SUMMARY OF THE INVENTION

It is accordingly an object of the invention to provide a semiconductor memory configuration and a DRAM configuration which overcome the above-mentioned disadvantages of the prior art apparatus of this general type.

In particular, it is an object of the invention, in a departure from the prior art, to provide a semiconductor memory configuration in which the isolation transistors have a lower reverse current in conjunction with a high active current.

With the foregoing and other objects in view there is provided, in accordance with the invention, a semiconductor memory configuration, including: a plurality of word lines; a plurality of bit lines; and a memory cell array including a plurality of memory cells configured in a matrix between the plurality of the word lines and the plurality of the bit lines. Each one of the memory cells includes a storage capacitor and an isolation transistor formed as a bipolar transistor.

In accordance with an added feature of the invention, each one of the memory cells includes a storage node connecting the storage capacitor thereof to the isolation transistor thereof; and in each one of the memory cells, the storage capacitor thereof is connected to a respective one of the plurality of the bit lines.

In accordance with an additional feature of the invention, in each one of the memory cells, the isolation transistor thereof has: a base connected to a respective one of the plurality of the word lines, an emitter for being held at a plate potential, and a collector that is connected to the storage node thereof.

In accordance with another feature of the invention, the storage capacitor of each one the memory cells has a high-epsilon insulator.

In accordance with a further feature of the invention, the high-epsilon insulator includes BST.

In accordance with a further added feature of the invention, the bipolar transistor of each one of the memory cells is an npn transistor.

In accordance with a further additional feature of the invention, each one of the word lines is formed by a doped semiconductor region.

In accordance with an added feature of the invention, there is provided, a doped semiconductor region for feeding a plate potential therethrough.

In accordance with an additional feature of the invention, there is provided, a silicon substrate on which the memory cell array is configured.

In accordance with yet an added feature of the invention, there is provided, an additional word line.

In accordance with yet an additional feature of the invention, the additional word line includes aluminum.

In accordance with yet another feature of the invention, in each one of the memory cells, the storage capacitor thereof is formed in a trench.

In accordance with yet a further feature of the invention, the word lines are formed from siliconized material.

In accordance with yet a further added feature of the invention, the storage capacitor of each one of the memory cells has a dielectric that includes an ONO layer.

In accordance with an added feature of the invention, the bipolar transistor of each one of the memory cells is a pnp transistor configured for receiving suitable word line voltages.

In the case of a semiconductor memory configuration of the type mentioned in the introduction, this object is achieved according to the invention by virtue of the fact that the isolation transistor is a bipolar transistor. In this case, in each memory cell, the storage capacitor is connected on the one hand to the bit line and on the other hand, via a storage node, to the isolation transistor. The base of the isolation transistor is connected to the word line, the emitter of the isolation transistor is at plate potential and the collector of the isolation transistor is connected to the storage node.

The invention thus enables a completely new kind of semiconductor memory configuration in which bipolar transistors can be used as isolation transistors in the memory cell array. This yields considerable advantages:

Given the same area as MOS transistors, above a specific drain voltage $U_D$ of 0.7 V, for example, bipolar transistors have a higher current than MOS transistors.

Furthermore, given the same area as MOS transistors, below a specific drain voltage $U_D$ of 0.7 V, for example, bipolar transistors have lower reverse currents than MOS transistors. This means that, given the same area, bipolar transistors conduct and block better than MOS transistors.

Bipolar transistors have favorable geometrical configuration possibilities and have an expedient technological construction.

In inventive semiconductor memory configuration of a storage capacitor and bipolar isolation transistor, unlike in the case of the conventional DRAM structures using MOS technology, the disturbance by the word line pulse on the bit line is extremely small.

With the inventive semiconductor memory configuration of a storage capacitor and a bipolar isolation transistor, it is possible to establish very small cells having an area requirement of 4 $F^2$ given an open structure (F=minimum dimension).

With the inventive semiconductor memory configuration of a storage capacitor and a bipolar isolation transistor, it is possible to produce symmetrical cell structures for the memory content I and the inverted content NI in a "folded" structure with an area requirement of 8 $F^2$.

Other features which are considered as characteristic for the invention are set forth in the appended claims.

Although the invention is illustrated and described herein as embodied in a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
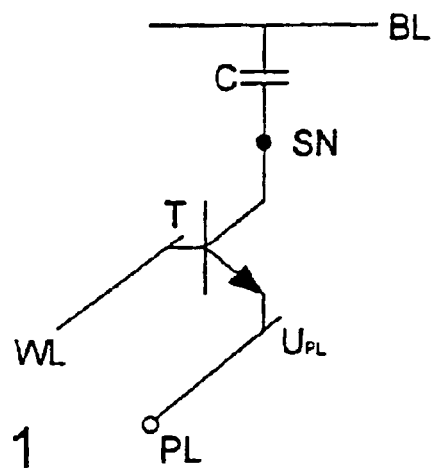
FIG. 1 is a circuit diagram of a memory cell of an inventive semiconductor memory configuration.

Referring now to the figures of the drawing in detail and first, particularly, to FIG. 1 thereof, there is shown a circuit diagram of an inventive memory cell of an inventive semiconductor memory configuration. This inventive memory cell includes a cell capacitor C, which lies between a bit line BL and a storage node SN, and a bipolar isolation transistor T. The collector of the bipolar isolation transistor T is connected to the storage node SN and the emitter of the bipolar isolation transistor T is connected to a plate PL with a fixed plate voltage $U_{PL}$. The base of the bipolar isolation transistor T is connected to a word line WL. Thus, the bipolar isolation transistor T is not connected to the bit line BL as in the case of the customary DRAM memory cells, but rather is connected to a plate PL which is at the constant plate voltage $U_{PL}$. In this case, the storage charge is situated on the storage node SN between the cell capacitor C and the isolation transistor T.

Figure 2:
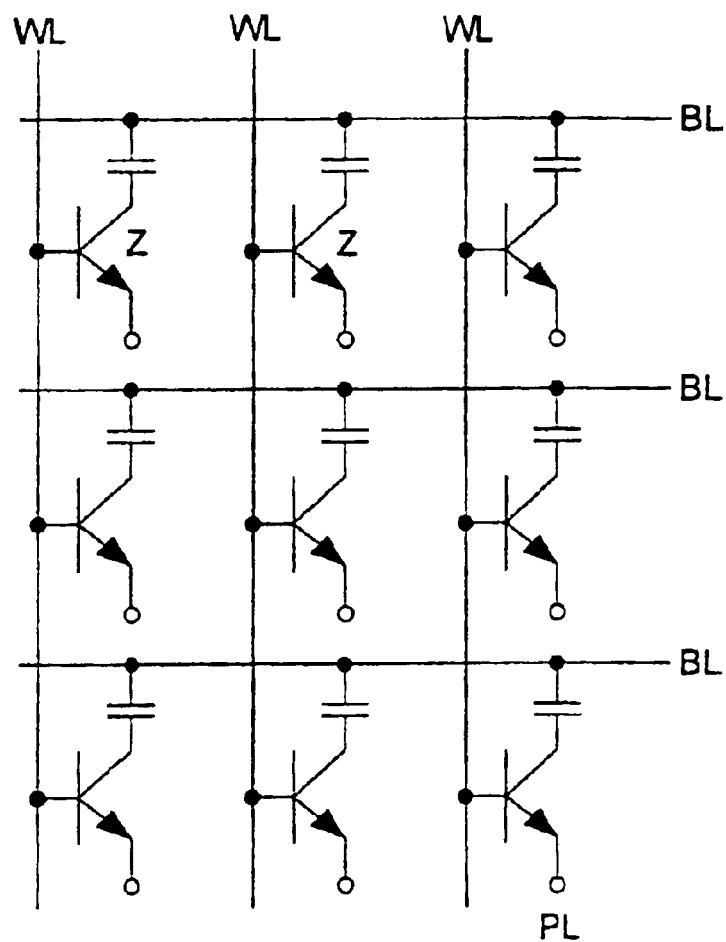
FIG. 2 is a circuit diagram of a memory array structure of an inventive semiconductor memory configuration.
Figure 3:
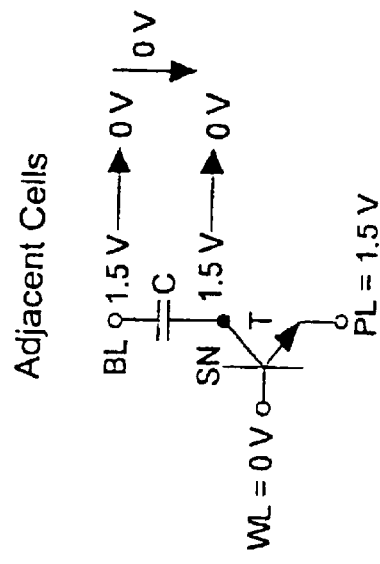
FIGS. 3 and 4 are circuit diagrams illustrating the state when writing a "1" to a memory cell of the semiconductor memory configuration.
Figure 4:
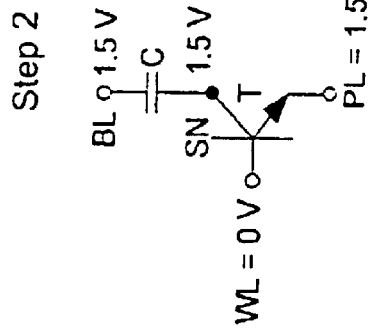

FIG. 2 shows the construction of the memory array structure with the individual memory cells Z in the inventive semiconductor memory configuration.

In the case of the inventive semiconductor memory configuration, the word line WL for switching on a bipolar isolation transistor T must only be put at a word line voltage $U_{WL}=U_{PL}+0.7$ V, which is independent of whether a "1" or "0" state will be written in or read out, since the plate PL is at the fixed voltage $U_{PL}$ of 1.5 V, for example.

First the procedure when writing a "1" or a "0" will be explained in more detail below with reference to FIGS. 3 to 8. In this case, the method for writing a "1" or "0" to the inverted bipolar transistor cell Z, disregarding parasitic elements or the coupling thereof, is summarized in table 1. In this case, it is assumed that the bit line BL is at a voltage of 1.5 V when writing a "1", while the bit line will have a voltage of 0 V when writing a "0".

TABLE 1

|    | 0          | Step 1    | Step 2    |
|----|------------|-----------|-----------|
| BL | 1.5 V/0 V  | 1.5 V/0 V | 1.5 V/0 V |
| SN | Don't care | 1.5 V     | 1.5 V     |
| WL | 0 V        | 2.2 V     | 0 V       |
| PL | 1.5 V      | 1.5 V     | 1.5 V     |

It goes without saying that the voltage values specified are merely examples. Thus, other voltage values can also be assumed.

In an initial state, the plate PL is always at 1.5 V. The word line WL is switched off, while the bit line BL and the storage node SN have a potential (don't care) dependent on the history.

In a step 1 (See FIGS. 3 and 6), the word line WL is put at 2.2 V. The bit line BL is fixed at 1.5 V for writing a "1" (See FIG. 3) or at 0 V for writing a "0" (See FIG. 6). The storage node SN is thereby pulled to the plate voltage $U_{PL}$ of 1.5 V.

In step 2 (See FIGS. 4 and 7), the word line WL is then put at 0 V and is thereby switched off. Across the storage capacitor C, now there is 0 V for the "1" (See FIG. 4) or 1.5 V for the "0" (See FIG. 7).

Figure 5:
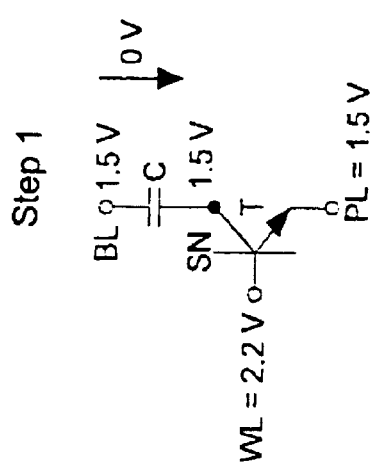
FIG. 5 is a circuit diagram showing the state of a non-selected cell when writing a "1" to an adjacent memory cell of the semiconductor memory configuration.
Figure 6:
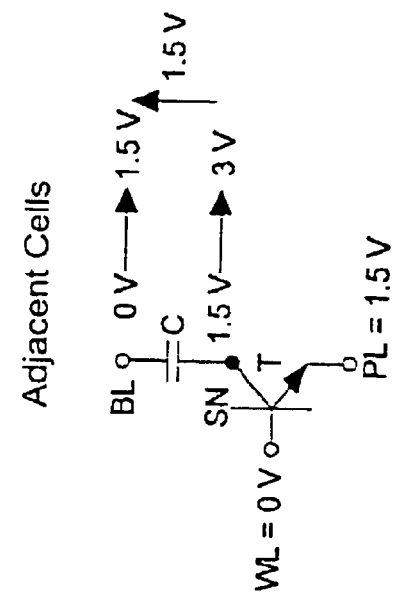
FIGS. 6 and 7 are circuit diagrams illustrating the state when writing a "0" to a memory cell of the semiconductor memory configuration.
Figure 7:
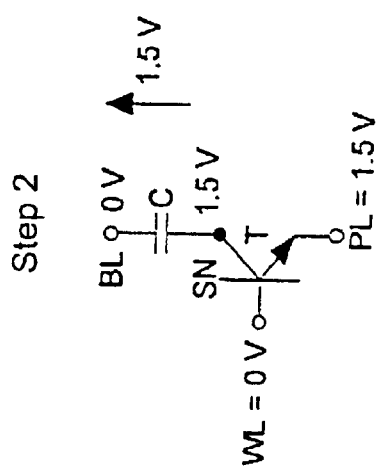
Figure 8:
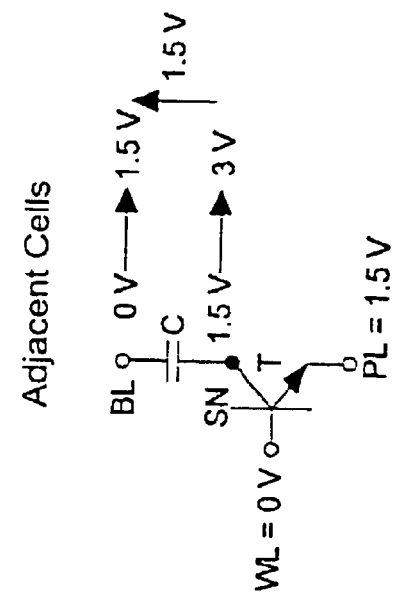
FIG. 8 is a circuit diagram showing the state of a non-selected cell when writing a "0" to an adjacent memory cell of the semiconductor memory configuration.

FIGS. 5 and 8 show the corresponding voltage conditions for nonselected adjacent cells of the memory cell array. Although the voltage on the storage nodes SN of the adjacent cells is changed with the bit line voltage, the voltage across the storage capacitor C of the adjacent cells is preserved, so that the respective memory content of these adjacent cells is not impaired.

The procedure when reading a "1" or "0" from a memory cell in the semiconductor memory configuration will be explained below with reference to FIGS. 9 to 12. This read operation includes two steps: namely the precharge and the actual reading. In this case, it is assumed that the cell capacitance of a memory cell Z is about 10 times the capacitance of a bit line, and moreover, parasitic capacitances are disregarded.

Figure 9:
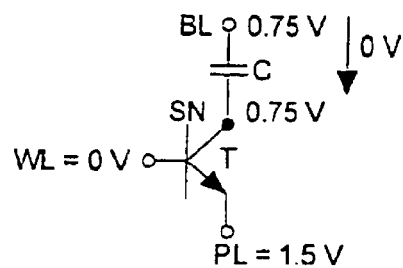
FIG. 9 is a circuit diagram illustrating the state when precharging a memory cell of the semiconductor memory configuration to a "1"
Figure 10:
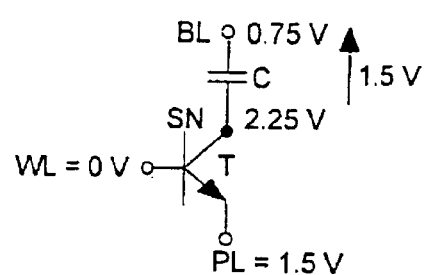
FIG. 10 is a circuit diagram illustrating the state when precharging a memory cell of the semiconductor memory configuration to a "0"
Figure 11:
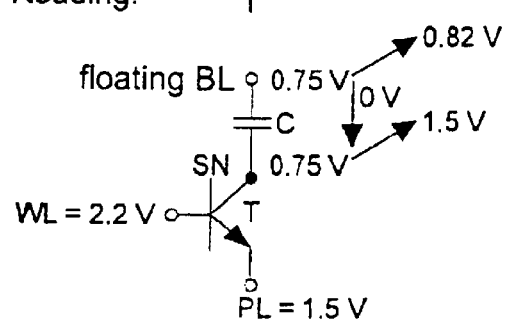
FIG. 11 is a circuit diagram illustrating the state when reading a "1" from a memory cell of the semiconductor memory configuration.
Figure 12:
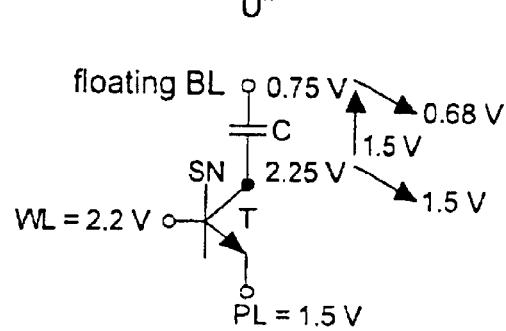
FIG. 12 is a circuit diagram illustrating the state when reading a "0" from a memory cell of the semiconductor memory configuration.

When reading a "1" or "0" the bit line BL is precharged to a voltage of 0.75 V and is then made floating (See FIGS. 9 and 10). The voltage on the storage node SN is subsequently at 0.75 V for a "1" (See FIG. 9) and at 2.25 V for a "0" (See FIG. 10). In both cases, the plate PL is fixed at the plate voltage $U_{PL}$ of 1.5 V, while the word line WL is at 0 V.

Figure 13:
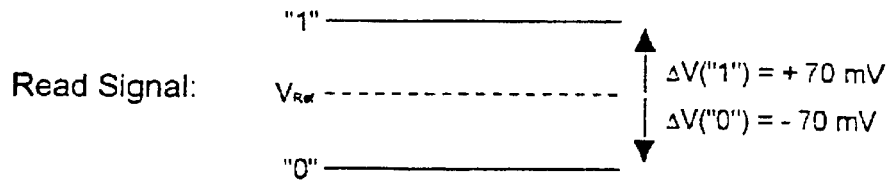
FIG. 13 is a diagram that diagrammatically illustrates the profile of a read signal "1" or "0"

In order to read out the memory content, the word line WL is put at 2.2 V. As a result, the transistor T is turned on, so that the storage node SN is pulled to the plate potential, that is to say 1.5 V. Given the assumed ratio of the cell capacitance to the bit line capacitance of 10, the voltage on the bit line becomes 0.82 V for a "1" and 0.68 V for a "0", which corresponds to a read signal of ±70 mV (See FIG. 13).

This read signal is then evaluated and amplified in an evaluation unit, as in the case of a conventional DRAM, and is written back to the memory cell. FIGS. 14 to 21 show four different exemplary embodiments for realizing the semiconductor memory configuration. In general, it shall be noted that the reproduced thicknesses and widths are in no way true to scale.

Figure 14:
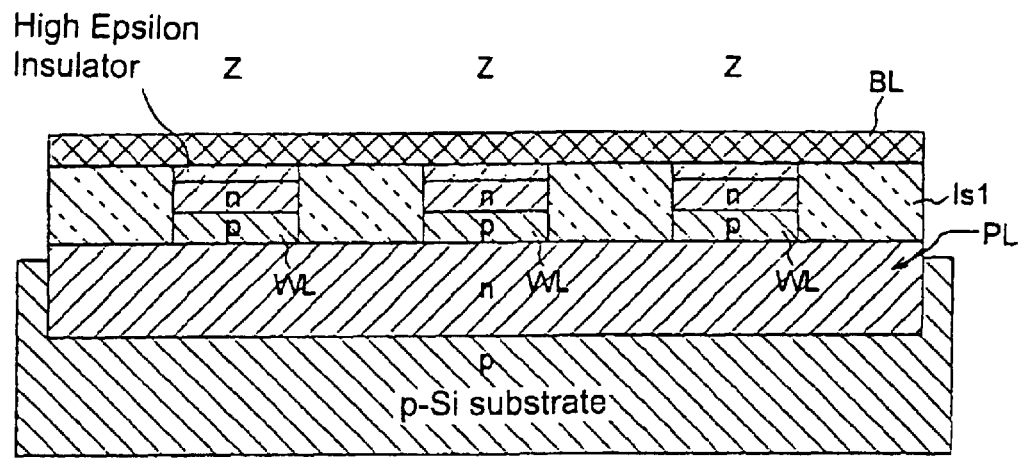
FIG. 14 is a cross sectional view of a cell array with inverted bipolar transistor cells and "high-epsilon" insulators.
Figure 15:
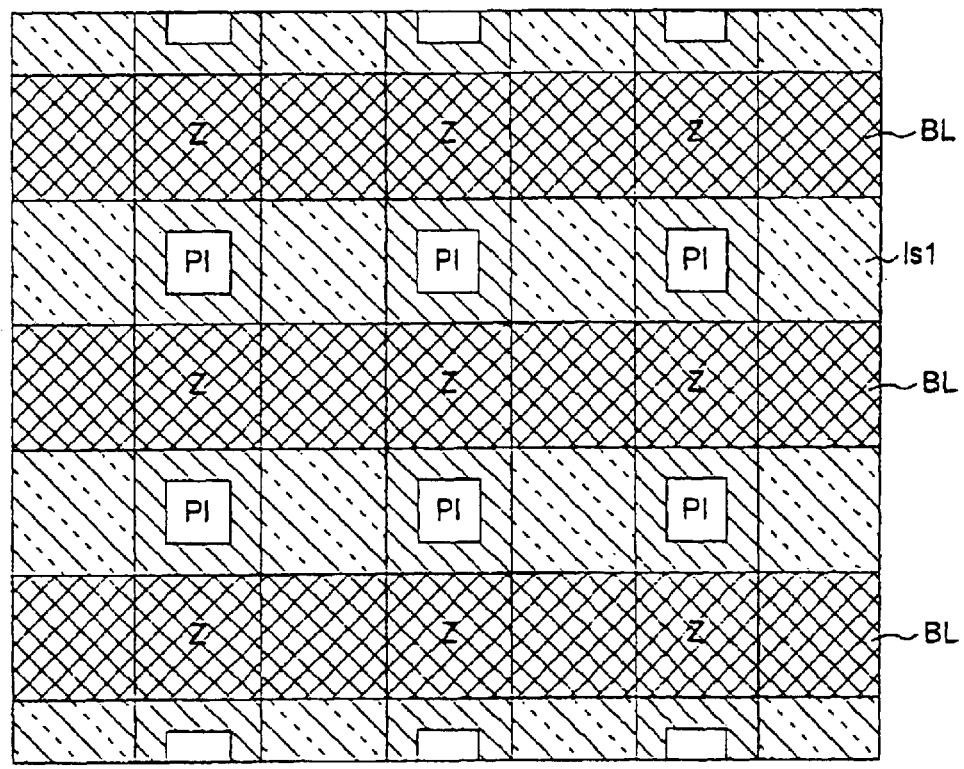
FIG. 15 is a plan view of the cell array with the inverted bipolar transistor cells and the "high-epsilon" insulators.
Figure 16:
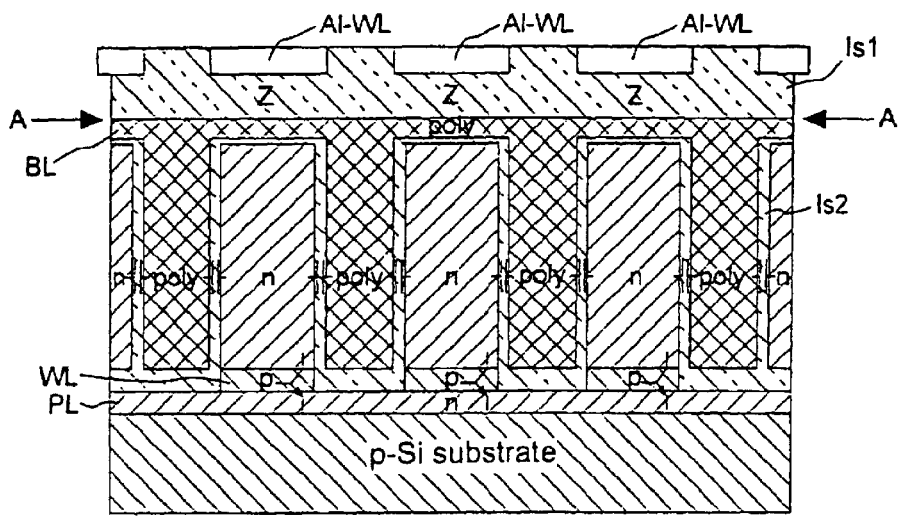
FIG. 16 is a cross sectional view of a cell array with inverted bipolar transistor cells using trench technology.
Figure 17:
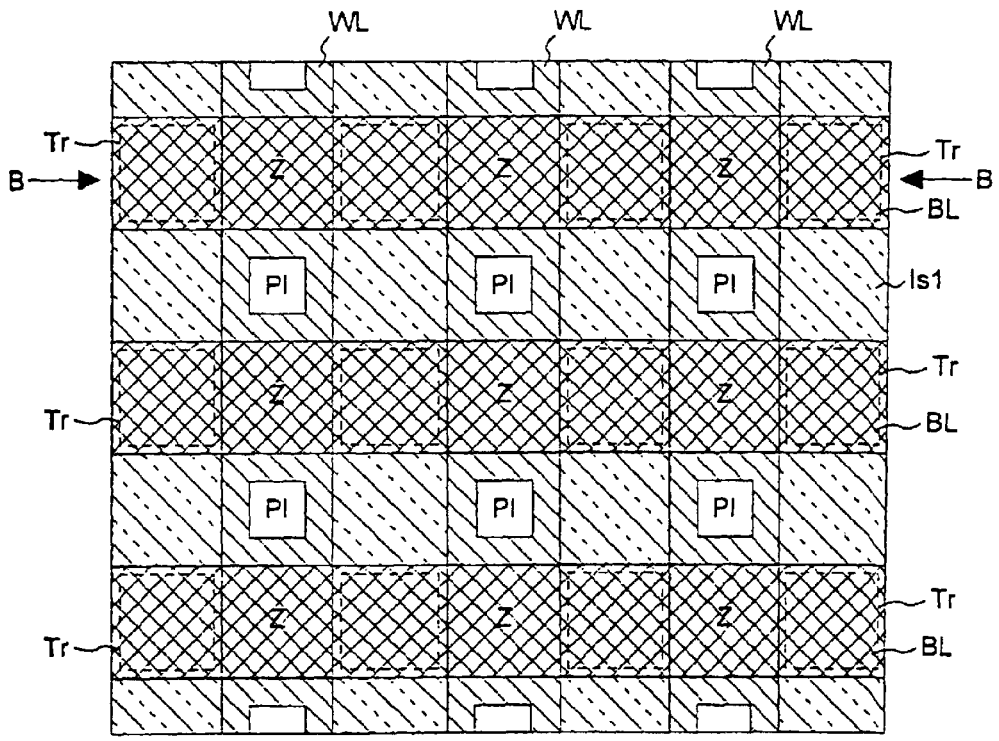
FIG. 17 is a plan view of the cell array with inverted bipolar transistor cells using trench technology.
Figure 18:
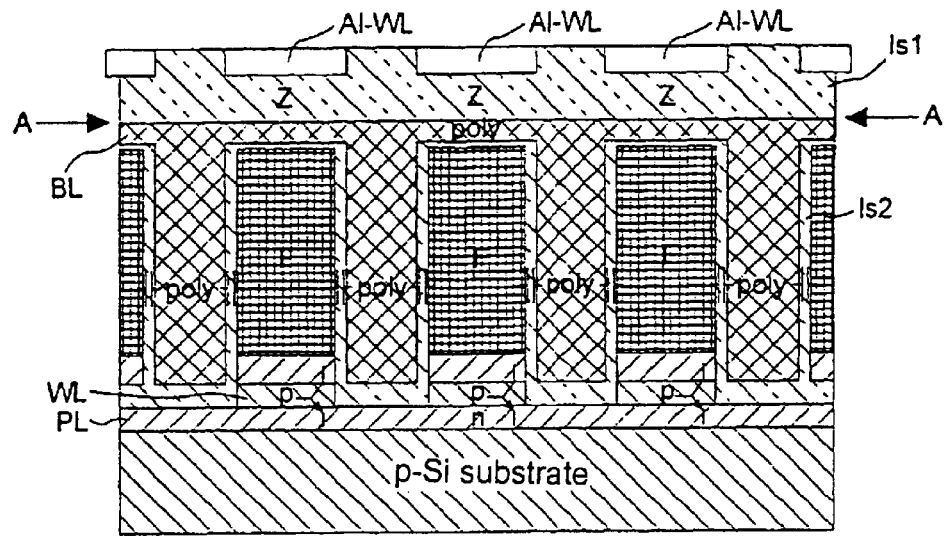
FIG. 18 is a cross sectional view of a cell array with inverted bipolar transistor cells using trench technology with polysilicon filling material.
Figure 19:
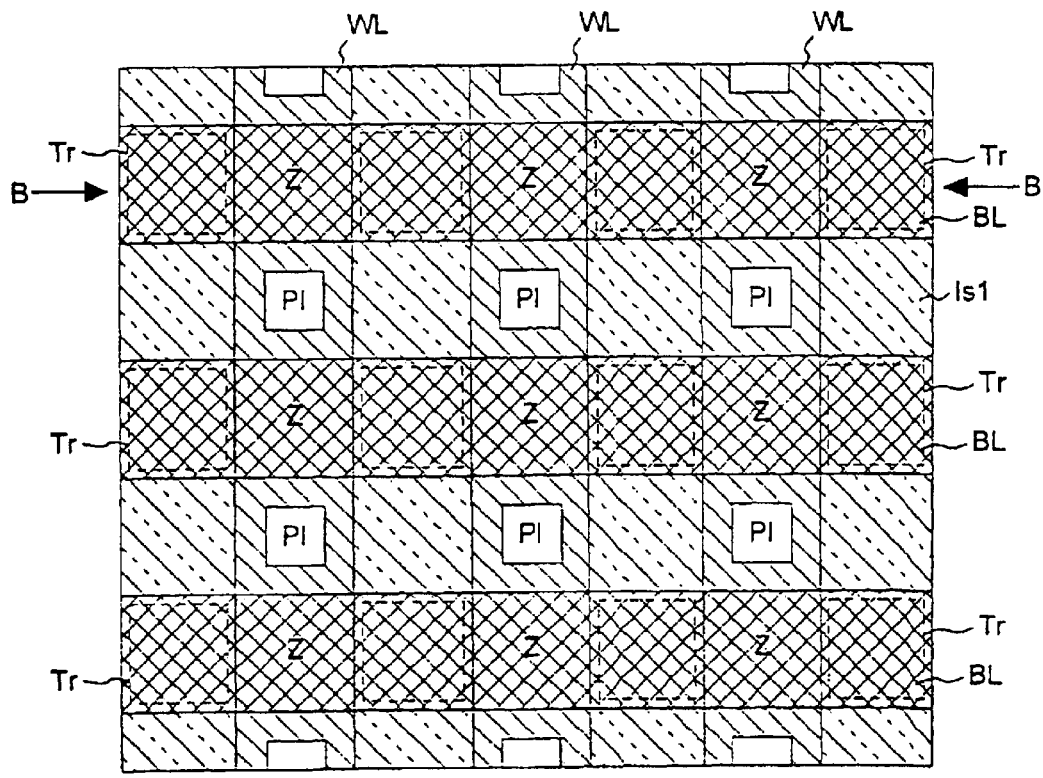
FIG. 19 is a plan view of the cell array with inverted bipolar transistor cells using trench technology with polysilicon filling material.
Figure 20:
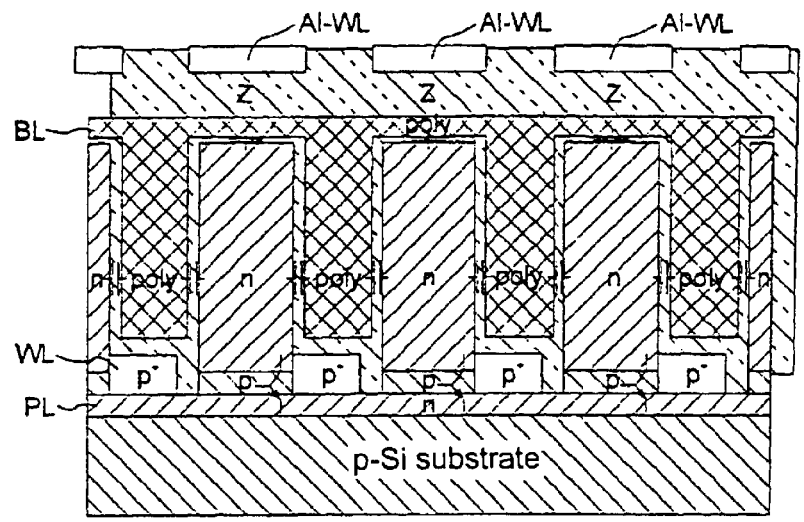
FIG. 20 is a cross sectional view of a cell array with inverted bipolar transistor cells and siliconized $p^+$-conducting word lines.
Figure 21:
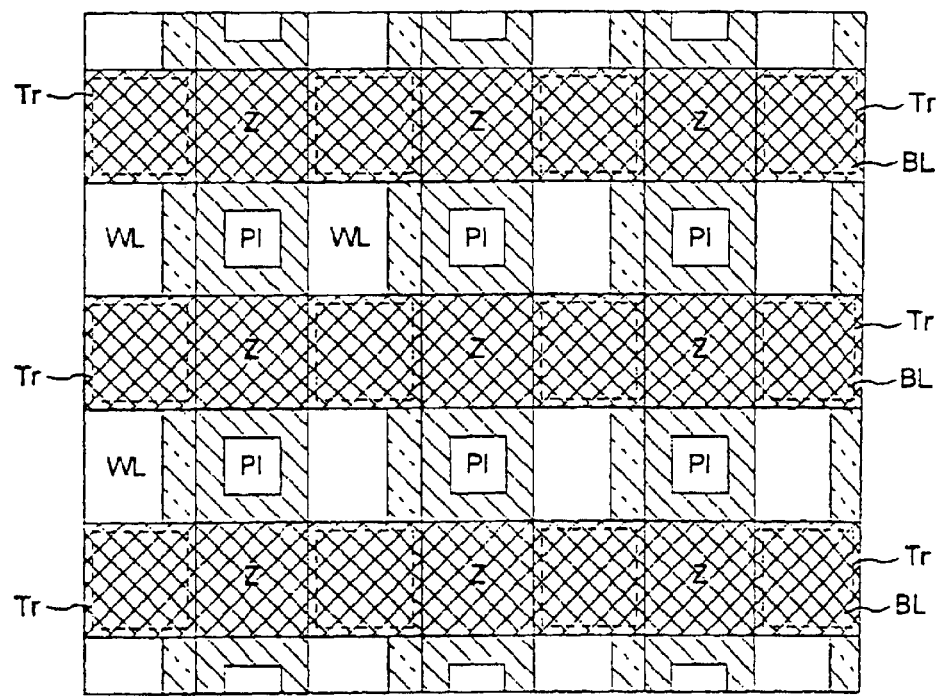
FIG. 21 is a plan view of the cell array with inverted bipolar transistor cells and siliconized $p^+$-conducting word lines.

In detail, FIGS. 14 and 15 show a cross sectional view and a plan view, respectively, of an inverted bipolar transistor cell with a high-epsilon insulator. FIGS. 16 and 17 show a cross sectional view and a plan view of a cell array with inverted bipolar transistor cells using trench technology. The plan view of FIG. 17 is taken in a plane AA of FIG. 16 and the cross sectional view of FIG. 16 is taken in a plane BB of FIG. 17. FIGS. 18 and 19 show a cell array with an inverted bipolar transistor cell using trench technology with a polycrystalline filling material made of, for example, n-doped polycrystalline silicon F. The plan view of FIG. 19 is taken in a plane AA of the cross section shown in FIG. 18, and the cross sectional view of FIG. 18 is taken in a plane BB of FIG. 19. FIGS. 20 and 21 show a cell array with an inverted bipolar transistor cell and a siliconized $p^+$-conducting word line WL. FIG. 20 is a cross sectional view and FIG. 21 is a plan view.

In then plan views shown in FIGS. 15, 17, 19 and 21, the individual parts are hatched in the same way as in the cross sectional views shown in FIGS. 14, 16, 18 and 20 in order to facilitate the assignment of these parts.

In detail, FIGS. 14 and 15 show how bipolar transistors with an npn structure can be realized below cell capacitors with a dielectric made of a high-epsilon insulator (for example BST or barium strontium titanate). In this case, a word line WL drives the p-conducting base and is contact-connected in order to reduce the resistance between each individual cell Z via a plug P1 or contact plug to an aluminum line (not illustrated) that is led parallel to the word lines WL. The storage capacitor and the isolation transistor are "stacked" in the exemplary embodiment shown in FIGS. 14 and 15, so that the "stacked" technology can be used. The bit line BL includes doped polycrystalline silicon, while the plate PL is embodied as a continuous n-conducting well in a p-conducting silicon substrate in order to provide a constant plate voltage $U_{PL}$ for all the of the cells Z. However, configurations other than a continuous n-conducting well in the p-conducting silicon substrate are also possible for the plate PL.

The exemplary embodiment shown in FIGS. 16 and 17 show a semiconductor memory configuration using trench technology. In this exemplary embodiment, the bit line BL is again formed from polycrystalline silicon, as in the exemplary embodiment shown in FIGS. 14 and 15, and in this case the bit line BL constitutes one electrode of the cell capacitor. The other electrode of the cell capacitor is formed by the n-conducting collector zone of the bipolar isolation transistor. Thus in this case, the dielectric of the storage capacitor includes an insulating layer Is2 which isolates the bit line BL or one electrode of the cell capacitor from the n-conducting collector zone or the other electrode of the cell capacitor. The emitters of the isolation transistors are connected to the plate PL, while the word lines WL are connected via plugs P1 to additional aluminum word lines Al-WL that run parallel to the word lines WL on an insulating layer Is1 above the bit lines BL. The aluminum word lines Al-WL serve for reducing the resistance of the p-doped word lines WL. The individual trenches Tr are indicated diagrammatically by dashed lines in FIG. 17.

For the insulating layers Is1, Is2, it is possible to use silicon dioxide (O) and/or silicon nitride (N), in particular, ONO structures are also possible.

The specific materials including silicon for the substrate or aluminum for the interconnects are, of course, merely examples. The same also applies to the specified conductivity types. It goes without saying that other materials and opposite conductivity types can also be used.

In the exemplary embodiment shown in FIGS. 18 and 19, a large part of the n-conducting collector material of the isolation transistor of the exemplary embodiment shown in FIGS. 16 and 17 is supplemented by, for example, n-doped polycrystalline silicon as a filling material F in order to simplify the technology. For the rest, the exemplary embodiment shown in FIGS. 18 and 19 corresponds to the exemplary embodiment shown in FIGS. 16 and 17.

In the case of the exemplary embodiment shown in FIGS. 20 and 21, which like the exemplary embodiment of FIGS. 18 and 19, corresponds, in principle, to the exemplary embodiment of FIGS. 16 and 17, the word line WL is embodied as a siliconized $p^+$-conducting region and is contact-connected to the p-conducting base of the respective npn transistor. In this exemplary embodiment, it is possible, if appropriate, to also dispense with the aluminum word line Al-WL.

Figure 22:
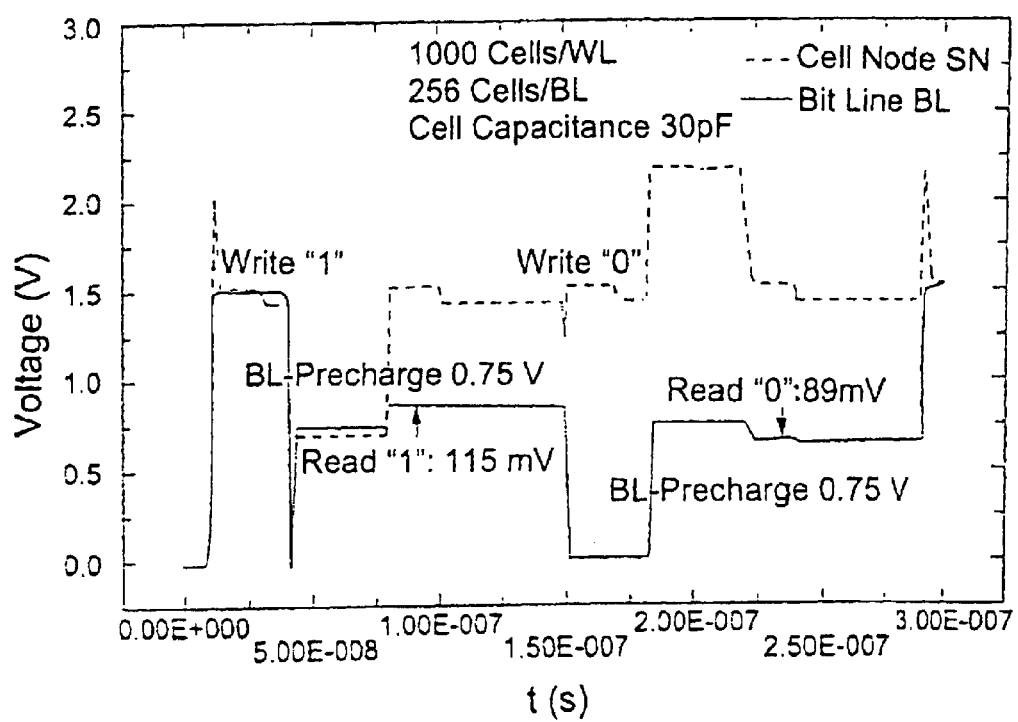
FIG. 22 shows the profile of voltages on a bit line BL and a cell node SN in the semiconductor memory configuration.
Figure 23:
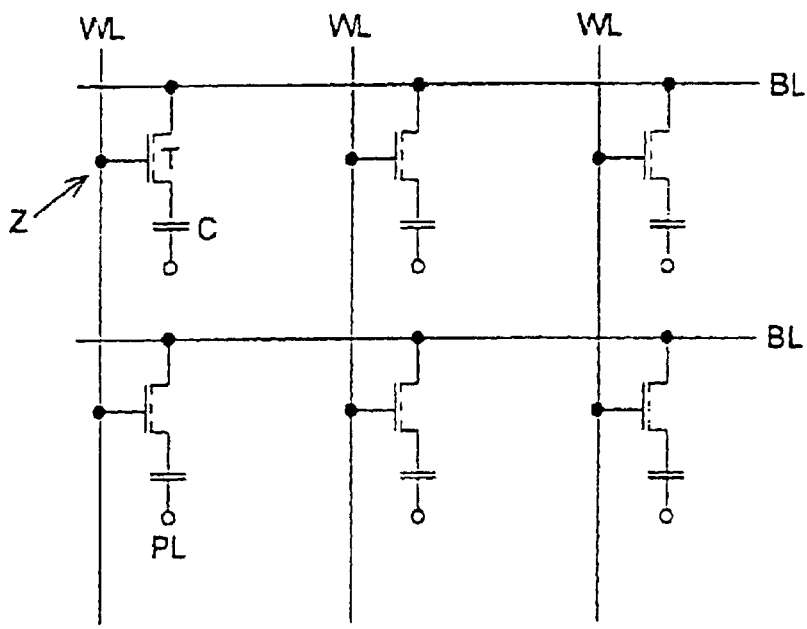
FIG. 23 is a circuit diagram of a portion of a prior art DRAM cell array.
Figure 24:
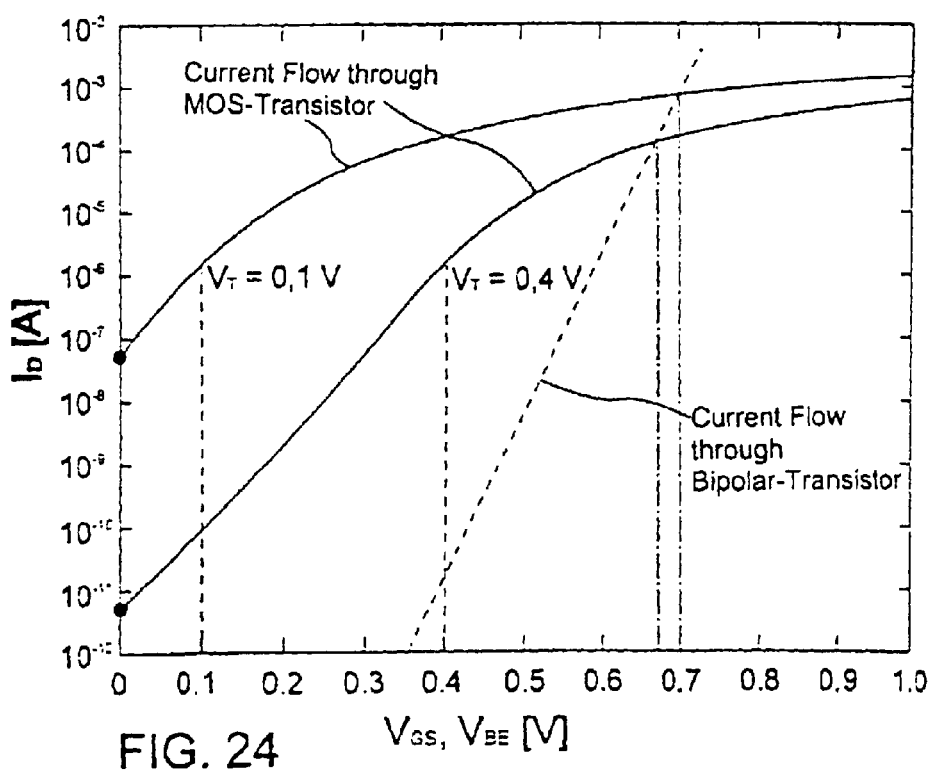
FIG. 24 is a diagram showing a comparison of the current profile of MOS transistors and a bipolar transistor given the same area; the drain or collector current $I_D$ (A) is plotted in dependence on the gate-source voltage $V_{GS}$ (V) or the base-emitter voltage (V).

FIG. 22 shows the profile of the voltage (V) in dependence on the time t (s) on the bit line BL or the storage node SN (See FIG. 1). A read signal of 115 mV is obtained for a "1" and a read signal of 0.89 mV is obtained for a "0".

For the isolation transistor T, a pnp bipolar transistor with correspondingly suitable word line voltages can also be used instead of an npn bipolar transistor.

We claim:

1. A semiconductor memory configuration, comprising:
   a plurality of word lines;
   a plurality of bit lines; and
   a memory cell array including a plurality of memory cells configured in a matrix between said plurality of said word lines and said plurality of said bit lines;
   each one of said plurality of said memory cells including a storage capacitor and an isolation transistor formed as a bipolar transistor, in each one of said plurality of said memory cells, said storage capacitor is formed in a trench.

2. The semiconductor memory configuration according to claim 1, wherein:
   each one of said plurality of said memory cells includes a storage node connecting said storage capacitor thereof to said isolation transistor thereof; and
   in each one of said plurality of said memory cells, said storage capacitor thereof is connected to a respective one of said plurality of said bit lines.

3. The semiconductor memory configuration according to claim 2, wherein in each one of said plurality of said memory cells, said isolation transistor thereof has:
   a base connected to a respective one of said plurality of said word lines,
   an emitter for being held at a plate potential, and
   a collector that is connected to said storage node thereof.

4. The semiconductor memory according to claim 1, wherein: said storage capacitor of each one said plurality of said memory cells has a high-epsilon insulator.

5. The semiconductor memory configuration according to claim 4, wherein: said high-epsilon insulator includes BST.

6. The semiconductor memory according to claim 1, wherein: said bipolar transistor of each one of said plurality of said memory cells is an npn transistor.

7. The semiconductor memory configuration according to claim 1, wherein: each one of said plurality of said word lines is formed by a doped semiconductor region.

8. The semiconductor memory configuration according to claim 1, comprising: a doped semiconductor region for feeding a plate potential therethrough.

9. The semiconductor memory configuration according to claim 1, comprising: a silicon substrate on which said memory cell array is configured.

10. The semiconductor memory configuration according to claim 1, comprising: an additional word line.

11. The semiconductor memory configuration according to claim 10, wherein: said additional word line includes aluminum.

12. The semiconductor memory configuration according to claim 1, wherein: said plurality of said word lines are formed from siliconized material.

13. The semiconductor memory configuration according to claim 1, wherein: said storage capacitor of each one said plurality of said memory cells has a dielectric that includes an ONO layer.

14. The semiconductor memory configuration according to claim 1, wherein: said bipolar transistor of each one of said plurality of said memory cells is a pnp transistor configured for receiving suitable word line voltages.

15. A DRAM configuration, comprising:
   a plurality of word lines;
   a plurality of bit lines; and
   a memory cell array including a plurality of memory cells configured in a matrix between said plurality of said word lines and said plurality of said bit lines;
   each one of said plurality of said memory cells including a storage capacitor and an isolation transistor formed as a bipolar transistor, said storage capacitor of each one said plurality of said memory cells having a high-epsilon insulator;
   each one of said plurality of said memory cells including a storage node connecting said storage capacitor thereof to said isolation transistor thereof;
   in each one of said plurality of said memory cells, said storage capacitor thereof being connected to a respective one of said plurality of said bit lines; and
   in each one of said plurality of said memory cells, said isolation transistor thereof having: a base connected to a respective one of said plurality of said word lines, an emitter for being held at a plate potential, and a collector connected to said storage node thereof.

* * * * *